US009455380B2

(12) United States Patent
Moon et al.

(10) Patent No.: US 9,455,380 B2
(45) Date of Patent: Sep. 27, 2016

(54) HIGH COLOR RENDERING LIGHT EMITTING DEVICE INCLUDING DIFFERENT PHOSPHORS

(71) Applicant: LG ELECTRONICS INC., Seoul (KR)

(72) Inventors: Euna Moon, Seoul (KR); Dohyung Lee, Seoul (KR); Seokhoon Kang, Seoul (KR); Jeongsoo Lee, Seoul (KR); Sejoon You, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 14/621,124

(22) Filed: Feb. 12, 2015

(65) Prior Publication Data
US 2015/0357531 A1 Dec. 10, 2015

(30) Foreign Application Priority Data

Jun. 5, 2014 (KR) .................. 10-2014-0068051

(51) Int. Cl.
*H01L 33/00* (2010.01)
*H01L 33/50* (2010.01)
*C09K 11/77* (2006.01)

(52) U.S. Cl.
CPC ......... *H01L 33/504* (2013.01); *C09K 11/7721* (2013.01); *C09K 11/7731* (2013.01); *C09K 11/7734* (2013.01); *C09K 11/7774* (2013.01); *H01L 33/505* (2013.01)

(58) Field of Classification Search
CPC ............ H01L 33/504; C09K 11/7721; C09K 11/7731; C09K 11/7734; C09K 11/7774
USPC ......................................... 257/98
See application file for complete search history.

(56) References Cited

U.S. PATENT DOCUMENTS

2005/0199897 A1  9/2005 Setlur et al.
2006/0065907 A1  3/2006 Lee et al.
(Continued)

FOREIGN PATENT DOCUMENTS

DE  WO 2009/083867 A1 * 7/2009 .......... G02F 1/1335
EP  1837386 A1  9/2007
(Continued)

OTHER PUBLICATIONS

Kim et al., "Red-Emitting (Sr,CA)AlSiN3:Eu2+ Phosphors Synthesized by Spark Plasma Sintering," ECS Journal of Solid State Science and Technology, vol. 2, No. 2, Nov. 27, 2012, 3 pages provided.

*Primary Examiner* — Matthew Gordon
(74) *Attorney, Agent, or Firm* — Birch, Stewart, Kolasch & Birch, LLP (57) ABSTRACT

A light emitting device is provided. The light emitting device includes a blue light emitting diode (LED); and phosphors including first to third phosphors, wherein the first phosphor is excited by light emitted from the blue LED, emits light having a main wavelength of about 495 nm to about 510 nm, and includes $BaSi_2O_2N_2$:Eu or $(Ba_x,Sr_{1-x})Si_2O_2N_2$:Eu where $0<x<1$, the second phosphor is excited by light emitted from the blue LED, emits light having a main wavelength of about 555 nm to about 575 nm, and includes $Lu_3Al_5O_{12}$:Ce or $(Lu_x,Gd_{1-x})_3Al_5O_{12}$:Ce where $0<x<1$, and the third phosphor is excited by light emitted from the blue LED, emits light having a main wavelength of about 580 nm to about 605 nm, and includes $(Ca_x,Sr_{1-x})AlSiN_3$:Eu where $0<x<1$.

10 Claims, 10 Drawing Sheets (56) References Cited

U.S. PATENT DOCUMENTS

| | | |
|---|---|---|
| 2008/0149957 A1 | 6/2008 | Kameshima et al. |
| 2009/0140205 A1* | 6/2009 | Kijima .................. C04B 35/581 252/301.6 R |
| 2009/0256166 A1 | 10/2009 | Koike et al. |
| 2011/0133237 A1 | 6/2011 | Koike et al. |
| 2011/0227477 A1 | 9/2011 | Zhang et al. |
| 2012/0126275 A1 | 5/2012 | Eisert |
| 2013/0020931 A1 | 1/2013 | Ko et al. |

FOREIGN PATENT DOCUMENTS

| | | |
|---|---|---|
| EP | 1919000 A1 | 5/2008 |
| JP | 2013-500596 A | 1/2013 |
| JP | 2013-526007 A | 6/2013 |
| KR | 10-2013-0010283 A | 1/2013 |
| WO | WO 2005/091862 A2 | 10/2005 |

* cited by examiner

HIGH COLOR RENDERING LIGHT EMITTING DEVICE INCLUDING DIFFERENT PHOSPHORS

CROSS-REFERENCE TO RELATED APPLICATIONS

The present application claims priority of Korean Patent Application No. 10-2014-0068051 filed on Jun. 5, 2014, which is hereby incorporated by reference in its entirety.

BACKGROUND

The present disclosure relates to a light emitting device, and more particularly, to a light emitting device that may provide a high color rendering white light similar to a natural light.

A light emitting diode (LED) is a highly efficient and environmental-friendly light source and is taking center stage in various fields. For example, the LED is being used in many fields such as a display device, a car, and general lighting. In particular, a demand for a white-light emitting device implementing a white light is gradually increasing.

A phosphor in the LED functions as a medium that changes energy of an excitation source to energy of a visible light and the efficiency of the phosphor is an important element associated directly with the efficiency of a display product.

There is a light emitting device using a blue LED as one of light emitting devices emitting a white light. The light emitting device using the blue LED uses a blue light as an excitation source to apply a yellow phosphor emitting a yellow light to a LED emitting a blue light, so the blue light emitted from the blue LED is mixed with the yellow light emitted from the yellow phosphor to implement a white color.

The light emitting device emitting the white light uses a way of applying a YAG:Ce phosphor showing a yellow color to the blue LED to obtain the white light, as a method of applying a phosphor to the blue LED to use a blue light emitted from the blue LED and a second light source emitted from the phosphor.

However, there are limitations in that the method involves quantum deficits resulting from using the second light and efficiency decrease resulting from re-emission efficiency and color rendering is not easy. Thus, since a typical white-light emitting device is implemented by combining the blue LED and the yellow phosphor, it lacks green and red components and thus it is difficult to express natural colors. Thus, the typical white-light emitting device is being limitatively applied to the screen of a portable phone or a notebook computer. Nevertheless, it has been widely used because it is easy to operate and remarkably cheap.

The light emitting device using the typical blue LED has used a method of increasing the content of a phosphor generating the second light of a red region in order to provide a high color rendering white light source.

Figure 1:
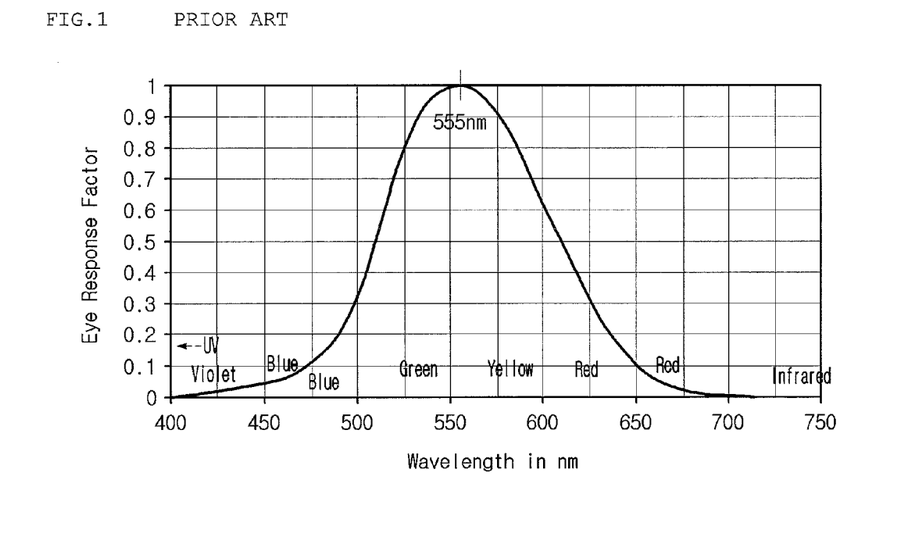
FIG. 1 is a graph of wavelength vs. human being's eye response factor.

FIG. 1 is a graph of wavelength vs. human being's eye response factor.

As shown in FIG. 1, a human being's eye response factor varies depending on the wavelength of light. When the eye response factor of light having a wavelength of approximately 555 nm is 1, the eye response factor of light having a wavelength of 520 nm is 0.71, the eye response factor of light having a wavelength of 580 nm is 0.87, the eye response factor of light having a wavelength of 605 nm is 0.57, and the eye response factor of light having a wavelength of 630 nm is 0.27.

That is, even though the same amount of light is generated, light having a wavelength of 555 nm and light having a wavelength of 630 nm have about a four-fold difference in efficiency.

Figure 2:
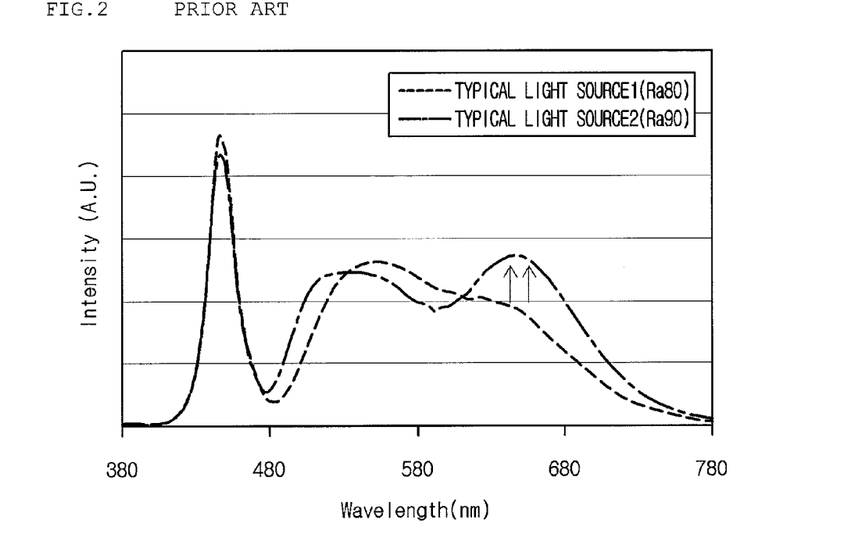
FIG. 2 shows a light emitting spectrum of a white light reinforcing a red region in order to provide a high color rendering white light source.

FIG. 2 shows a light emitting spectrum of a white light reinforcing a red region in order to provide a high color rendering white light source.

Referring to FIG. 2, a correlation color temperature (CCT) and a color rendering index (CRI) are generally used as a performance index evaluating the characteristic of a white light, in which case the white light shows a dazzling, blue color as the CCT increases, and the white light is close to solar light (natural light) as the CRI increases. In particular, the CRI is used as an important index evaluating the performance of a white light. The CRI represents how the color of an object varies when the object is lit by solar light and by an artificial light source, in which case the color of the object when the object is lit by the solar light is defined as 100. That is, the CRI is an index representing how close is the color of the object under the artificial light source to when the solar light is lit and is represented by a figure between 0 to 100. The CRI of an incandescent lamp being currently distributed in the market is equal to or higher than about 80 and the CRI of a fluorescent lamp is equal to or higher than about 75.

As shown in FIG. 2, when a red region is reinforced in order to enhance the CRI of a typical light source 1 having CRI of about 80, it is possible to obtain a light emitting spectrum such as a typical light source 2 which has CRI of about 90.

However, since the eye response factor of light of a red wavelength band is too low there is a need to use many red phosphors that are expensive in comparison to a red or yellow phosphor, there is a limitation in that costs of phosphors remarkably increase, as mentioned above.

SUMMARY

Embodiments provide a light emitting device that may emit a high color rendering white light.

Embodiments also provide a light emitting device that may emit a high color rendering white light without using an expensive red phosphor.

Embodiments provide a light emitting device that may emit a high color rendering white light by using a blue light emitting diode and mixed phosphors of two or three kinds of phosphors.

In one embodiment, a light emitting device includes a blue light emitting diode (LED); and phosphors including first to third phosphors, wherein the first phosphor is excited by light emitted from the blue LED, emits light having a main wavelength of about 495 nm to about 510 nm, and includes $BaSi_2O_2N_2$:Eu or $(Ba_xSr_{1-x})Si_2O_2N_2$:Eu where $0<x<1$, the second phosphor is excited by light emitted from the blue LED, emits light having a main wavelength of about 555 nm to about 575 nm, and includes $Lu_3Al_5O_{12}$:Ce or $(Lu_xGd_{1-x})_3Al_5O_{12}$:Ce where $0<x<1$, and the third phosphor is excited by light emitted from the blue LED, emits light having a main wavelength of about 580 nm to about 605 nm, and includes $(Ca_xSr_{1-x})AlSiN_3$:Eu where $0<x<1$.

In another embodiment, a light emitting device includes a blue light emitting diode (LED); and phosphors including first and second phosphors, wherein the first phosphor is excited by light emitted from the blue LED, emits light having a main wavelength of about 550 nm to about 555 nm, and includes $(Ba_x,Sr_{1-x})_2SiO_4$:Eu or $Lu_3(Al_x,Ga_{1-x})_5O_{12}$:Ce where 0<x<1, and the second phosphor is excited by light emitted from the blue LED, emits light having a main wavelength of about 585 nm to about 605 nm, and includes $(Ca_x,Sr_{1-x})AlSiN_3$:Eu where 0<x<1.

The details of one or more embodiments are set forth in the accompanying drawings and the description below. Other features will be apparent from the description and drawings, and from the claims.

DETAILED DESCRIPTION OF THE EMBODIMENTS

A light emitting device according to an embodiment is described below in detail with reference to the accompanying drawings.

A light emitting device according to an embodiment includes a blue light emitting diode (LED) and two or three kinds of phosphors. The light emitting device of the embodiment may achieve high color rendering, high efficiency and low costs.

The light emitting device of the embodiment may use a blue LED as an excitation light source, and the blued LED may use a gallium nitride based LED chip, for example.

Figure 3:
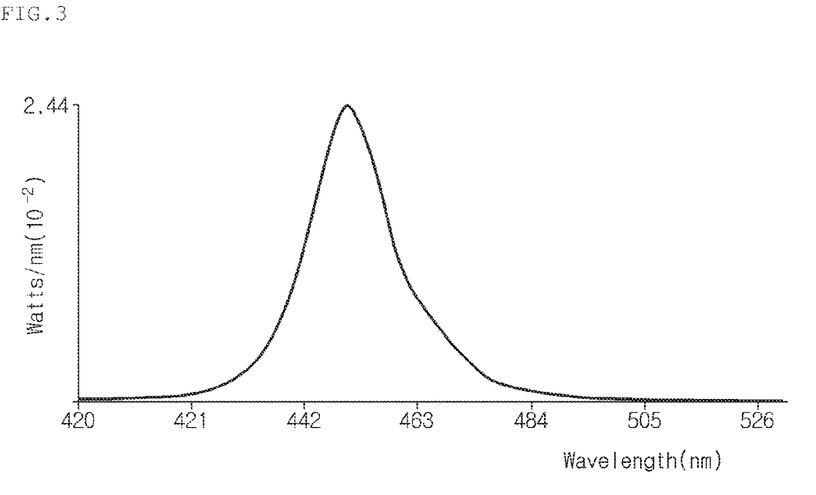
FIG. 3 shows the light emitting characteristic of a blue light emitting diode (LED) capable of being used in a light emitting device according to an embodiment.

FIG. 3 shows the light emitting characteristic of a blue LED capable of being used in a light emitting device according to an embodiment.

Referring to FIG. 3, an excitation light source in the light emitting device of the embodiment may use a blue LED having a peak wavelength of about 440 nm to about 460 nm and a main wavelength of about 445 nm to about 460 nm or a blue LED having a main wavelength of about 450 nm to about 455 nm in consideration of the efficiency of the excitation light source and the high color rendering of a white light emitted from the light emitting device. The full width at half maximum (FWHM) of a blue light emitted from the blue LED may also be about 19 nm to about 21 nm.

In the embodiment, a blue LED has been used which has a peak wavelength of about 445 nm, a main wavelength of about 451 nm, and a HWFM of about 19 nm.

A blue light emitted from the blue LED as described above may be combined with an excitation light emitted from phosphors to become a high color rendering white light, the phosphors including a first phosphor $BaSi_2O_2N_2$:Eu or $(Ba_x,Sr_{1-x})Si_2O_2N_2$:Eu where 0<x<1, a second phosphor including $Lu_3Al_5O_{12}$:Ce or $(Lu_x,Gd_{1-x})_3Al_5O_{12}$:Ce where 0<x<1, and a third phosphor including $(Ca_x,Sr_{1-x})AlSiN_3$:Eu where 0<x<1.

Also, the blue light emitted from the blue LED as described above may be combined with an excitation light emitted from phosphors to become a high color rendering white light, the phosphors including a first phosphor $(Ba_x,Sr_{1-x})_2SiO_4$:Eu where 0<x<1 or $Lu_3(Al_x,Ga_{1-x})_5O_{12}$:Ce where 0<x<1 and a second phosphor including $(Ca_x,Sr_{1-x})AlSiN_3$:Eu where 0<x<1.

First Embodiment

The light emitting device according to an embodiment includes a blue LED having a main wavelength of about 445 nm to about 460 nm and phosphors that are excited by a blue light emitted from the blue LED and include a first phosphor emitting light having a main wavelength of about 495 nm to about 510 nm, a second phosphor emitting light having a main wavelength of about 555 nm to about 575 nm and a third phosphor emitting light having a main wavelength of about 580 nm to about 605 nm. The third phosphor may emit light having a main wavelength of about 580 nm to about 599 nm.

The first phosphor may be $BaSi_2O_2N_2$:Eu or $(Ba_x,Sr_{1-x})Si_2O_2N_2$:Eu where 0<x<1 and its FWHM may be smaller than or equal to 40 nm. The second phosphor may be $Lu_3Al_5O_{12}$:Ce or $(Lu_x,Gd_{1-x})_3Al_5O_{12}$:Ce where 0<x<1 and its FWHM may be equal to or larger than about 80 nm. The third phosphor may be $(Ca_x,Sr_{1-x})AlSiN_3$:Eu where 0<x<1 and its FWHM may be equal to or larger than about 70 nm.

The first to third phosphors may be arranged around the blue LED, in which case they may be arranged in respective layers or mixed together.

Figure 4:
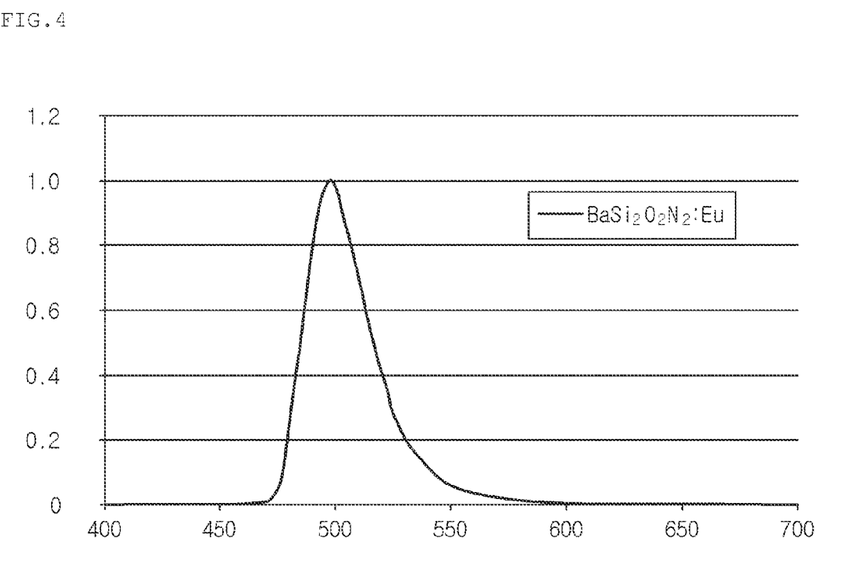
FIG. 4 shows a light emitting spectrum of a $BaSi_2O_2N_2$:Eu phosphor excited by light emitted from a blue LED as an embodiment of a first phosphor.

FIG. 4 shows a light emitting spectrum of a $BaSi_2O_2N_2$:Eu phosphor excited by light emitted from a blue LED as an embodiment of a first phosphor.

As shown in FIG. 4, the first phosphor may be $BaSi_2O_2N_2$:Eu or $(Ba_x,Sr_{1-x})Si_2O_2N_2$:Eu where 0<x<1 and in the embodiment, a $BaSi_2O_2N_2$:Eu phosphor is illustrated.

In the case of the light emitting spectrum of the $BaSi_2O_2N_2$:Eu phosphor excited by light emitted from the blue LED having a light emitting characteristic illustrated in FIG. 3, its main wavelength is about 501 nm, its peak wavelength is about 497 nm, and its FWHM is about 31 nm.

Figure 5:
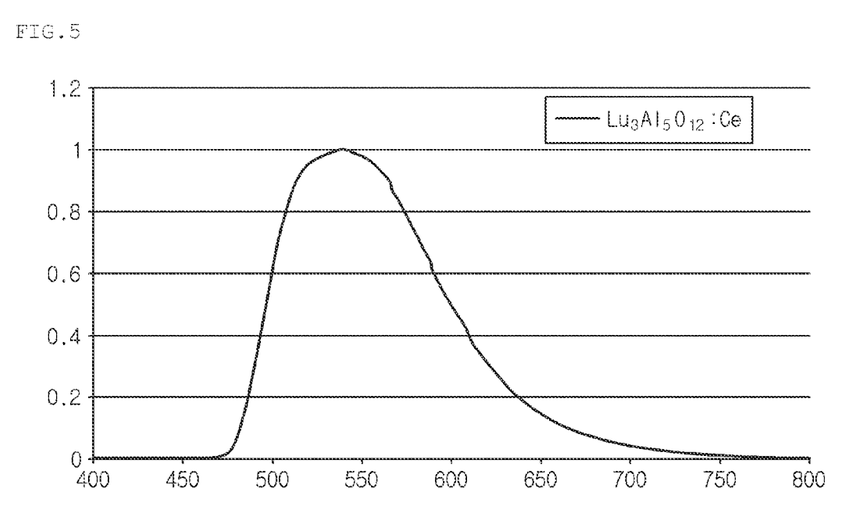
FIG. 5 shows a light emitting spectrum of a $Lu_3Al_5O_{12}$:Ce phosphor excited by light emitted from a blue LED as an embodiment of a second phosphor.

FIG. 5 shows a light emitting spectrum of a $Lu_3Al_5O_{12}$:Ce phosphor excited by light emitted from a blue LED as an embodiment of a second phosphor.

As shown in FIG. 5, the first phosphor may be $BaSi_2O_2N_2$:Eu or $(Ba_x,Sr_{1-x})Si_2O_2N_2$:Eu where 0<x<1 and in the embodiment, a $BaSi_2O_2N_2$:Eu phosphor is illustrated.

In the case of the light emitting spectrum of the $Lu_3Al_5O_{12}$:Ce phosphor excited by light emitted from the blue LED having a light emitting characteristic illustrated in FIG. 3, its main wavelength is about 559 nm, its peak wavelength is about 535 nm, and its FWHM is about 103 nm.

Figure 6:
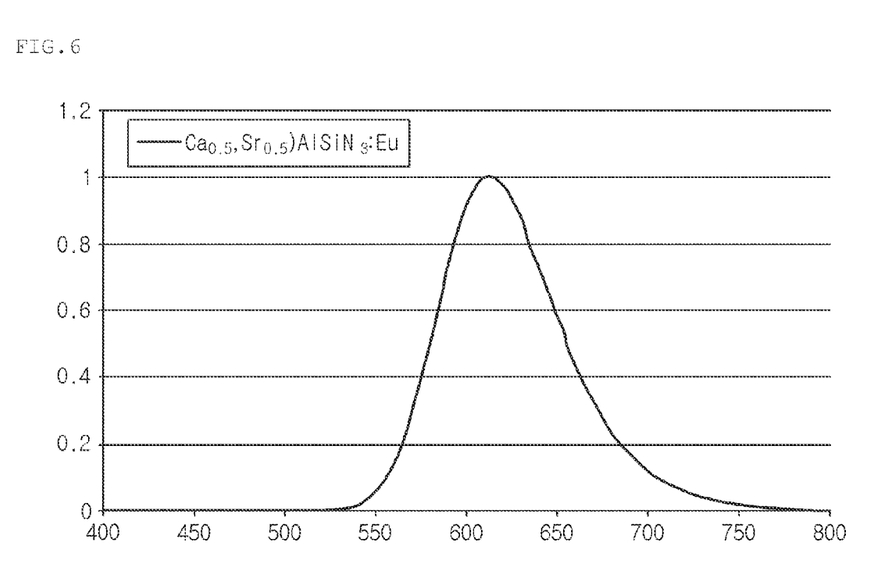
FIG. 6 shows a light emitting spectrum of a $(Ca_{0.5},Sr_{0.5})AlSiN_3$:Eu phosphor excited by light emitted from a blue LED as an embodiment of a third phosphor.

FIG. 6 shows a light emitting spectrum of a $(Ca_{0.5},Sr_{0.5})AlSiN_3$:Eu phosphor excited by light emitted from a blue LED as an embodiment of a third phosphor.

As shown in FIG. 6, the third phosphor may be $(Ca_x,Sr_{1-x})AlSiN_3$:Eu where 0<x<1 and in the embodiment, a $(Ca_{0.5},Sr_{0.5})AlSiN_3$:Eu phosphor is illustrated.

In the case of the light emitting spectrum of the $(Ca_{0.5},Sr_{0.5})AlSiN_3$:Eu phosphor excited by light emitted from the blue LED having a light emitting characteristic illustrated in FIG. 3, its main wavelength is about 598 nm, its peak wavelength is about 610 nm, and its FWHM is about 76 nm.

The light emitting device according to the embodiment may emit a high color rendering white light having a color rendering index (Ra) equal to or higher than 90 by using the blue LED and phosphors including the first to third phosphors.

The first phosphor may occupy about 10 wt % to about 25 wt % of all the phosphors, the second phosphor may occupy about 60 wt % to about 80 wt % of all the phosphors and the third phosphor may occupy about 3 wt % to about 20 wt % of all the phosphors.

In the first embodiment, the first phosphor occupies about 17 wt % of all the phosphors, the second phosphor occupies about 71 wt % of all the phosphors, and the third phosphor occupies about 12 wt % of all the phosphors, in which case the internal quantum efficiency of the phosphors is equal to or higher than about 80% and the efficiency of light emitted from the blue LED is about 135 lm/W.

In the first embodiment, since the first to third phosphors are mixed to implement a white light, there is an advantage in that a phosphor mixing freedom suitable for color ordinates is high, and in particular, since it is possible to decrease the main wavelength of light emitted from the third phosphor and thus light having a higher eye response factor than a red wavelength band is provided, it is possible to provide a light emitting device achieving low costs and high efficiency.

Figure 7:
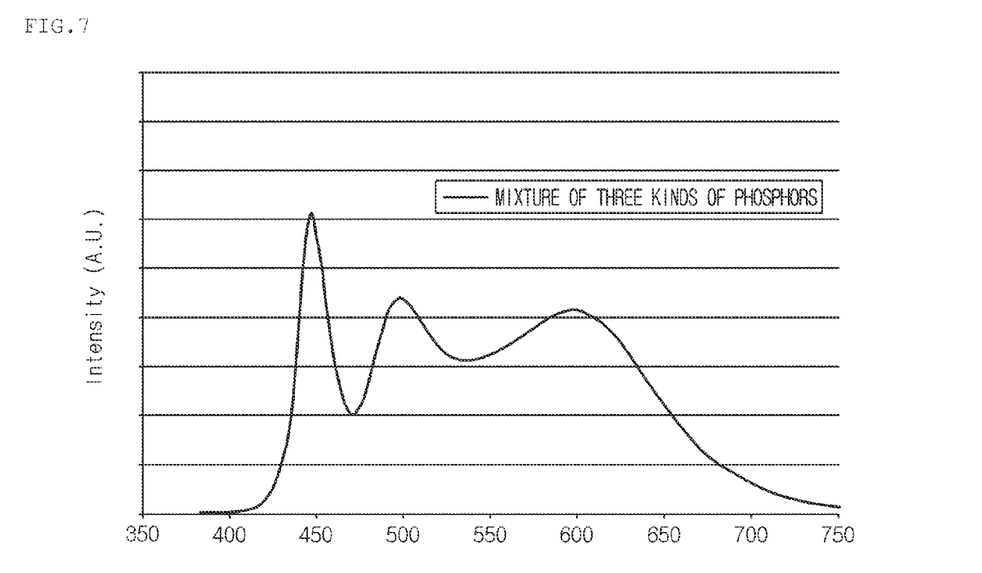
FIG. 7 shows a light emitting spectrum of light emitted from a light emitting device according to a first embodiment.

FIG. 7 shows a light emitting spectrum of light emitted from a light emitting device according to a first embodiment.

As shown in FIG. 7, since the light emitting spectrum of a light emitting device according to the first embodiment emits light having a main wavelength in a region having an excellent eye response factor, it is possible to emit high color rendering light even without using many expensive red phosphors.

Second Embodiment

The light emitting device according to an embodiment includes a blue LED having a main wavelength of about 445 nm to about 460 nm and phosphors that are excited by a blue light emitted from the blue LED and include a first phosphor emitting light having a main wavelength of about 550 nm to about 555 nm and a second phosphor emitting light having a main wavelength of about 580 nm to about 605 nm. The second phosphor may emit light having a main wavelength of about 580 nm to about 599 nm.

The first phosphor may be $(Ba_x,Sr_{1-x})_2SiO_4$:Eu where 0<x<1 or $Lu_3(Al_x,Ga_{1-x})_5O_{12}$:Ce where 0<x<1 and its FWHM may be smaller than or equal to 80 nm. The second phosphor may be $(Ca_x,Sr_{1-x})AlSiN_3$:Eu where 0<x<1 and its FWHM may be equal to or larger than about 70 nm.

The first and second phosphors may be arranged around the blue LED, in which case they may be arranged in individual layers or mixed together.

Figure 8:
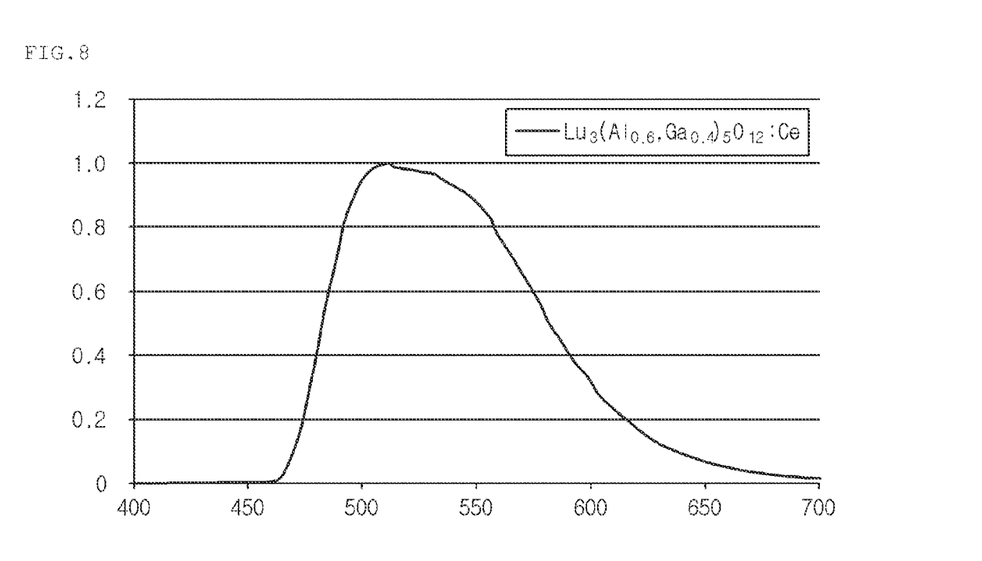
FIG. 8 shows a light emitting spectrum of a $Lu_3(Al_{0.6},Ga_{0.4})_5O_{12}$:Ce phosphor excited by light emitted from a blue LED as an embodiment of a first phosphor.

FIG. 8 shows a light emitting spectrum of a $Lu_3(Al_{0.6},Ga_{0.4})_5O_{12}$:Ce phosphor excited by light emitted from a blue LED as an embodiment of a first phosphor.

As shown in FIG. 8, the first phosphor may be $(Ba_x,Sr_{1-x})_2SiO_4$:Eu where 0<x<1 or $Lu_3(Al_x,Ga_{1-x})_5O_{12}$:Ce where 0<x<1 and in the embodiment, a $Lu_3(Al_x,Ga_{1-x})_5O_{12}$:Ce phosphor is illustrated.

In the case of the light emitting spectrum of the $Lu_3(Al_{0.6},Ga_{0.4})_5O_{12}$:Ce phosphor excited by light emitted from the blue LED having a light emitting characteristic illustrated in FIG. 3 its main wavelength is about 515 nm, its peak wavelength is about 554 nm, and its FWHM is about 101 nm.

A light emitting spectrum of a $(Ca_{0.5},Sr_{0.5})AlSiN_3$:Eu phosphor excited by light emitted from the blue LED as an embodiment of the second phosphor is shown in FIG. 6.

As shown in FIG. 6, the second phosphor may be $(Ca_x,Sr_{1-x})AlSiN_3$:Eu where 0<x<1 and in the embodiment, a $(Ca_{0.5},Sr_{0.5})AlSiN_3$:Eu phosphor is illustrated.

In the case of the light emitting spectrum of the $(Ca_{0.5},Sr_{0.5})AlSiN_3$:Eu excited by light emitted from the blue LED having a light emitting characteristic illustrated in FIG. 3, its main wavelength is about 598 nm, its peak wavelength is about 610 nm, and its FWHM is about 76 nm.

The light emitting device according to the second embodiment may emit a high color rendering white light having the color rendering index (Ra) equal to or higher than 90 by using the blue LED and phosphors including the first and second phosphors.

The first phosphor may occupy about 85 wt % to about 97 wt % of all the phosphors and the second phosphor may occupy about 3 wt % to about 15 wt % of all the phosphors.

In the embodiment, the first phosphor occupies about 90 wt % of all the phosphors and the second phosphor occupies about 10 wt % of all the phosphors, in which case the internal quantum efficiency of the phosphors is equal to or higher than about 80% and the efficiency of light emitted from the blue LED is about 130 lm/W.

In the second embodiment, since the first and second phosphors are mixed to implement a white light and thus the number of kinds of phosphors used is small, there are advantages in that a yield is high and mass production is easy.

Figure 9:
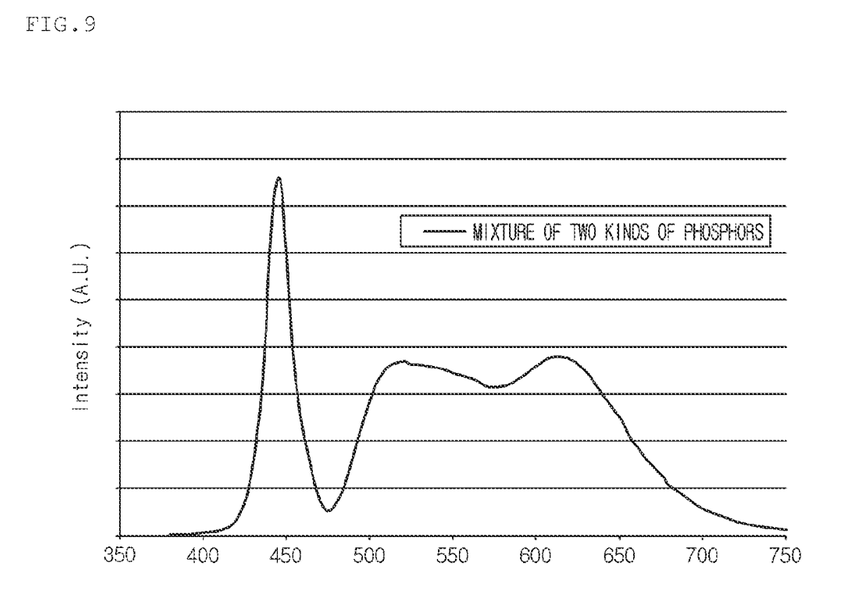
FIG. 9 shows a light emitting spectrum of light emitted from a light emitting device according to a second embodiment.

FIG. 9 shows a light emitting spectrum of light emitted from a light emitting device according to a second embodiment.

As shown in FIG. 9, since the light emitting spectrum of a light emitting device according to the second embodiment emits light having a main wavelength in a region having an excellent eye response factor, it is possible to emit high color rendering light even without using many expensive red phosphors.

Figure 10:
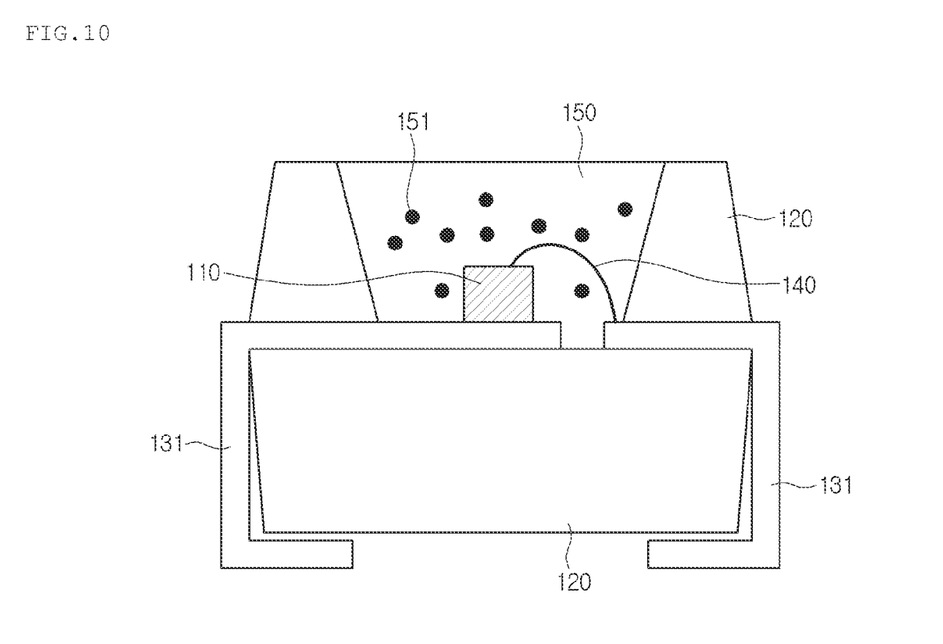
FIG. 10 shows a light emitting device according to embodiments.

FIG. 10 shows a light emitting device according to embodiments and the light emitting device may include a blue LED 110 and phosphors that are first to third phosphors according to the first embodiment or first and second phosphors according to the second embodiment and mixed in an encapsulation member 150 surrounding the blue LED 110. Also, other phosphors not mentioned in the embodiments may be further included as needed.

The blue LED 110 may be a GaN based LED that emits a blue light having a main wavelength of about 445 nm to about 460 nm, e.g., 455 nm and FWHM of about 19 nm to about 21 nm.

The blue LED 110 may be adhered and fixed to electrodes 131 or a body 120 by using a silver paste. The blue LED 110 may be electrically connected to any one of the electrodes 131 through the silver paste and to the other of the electrodes through a wire 140.

The encapsulation member 150 may be manufactured by scattering a phosphor 151 of an embodiment over an epoxy resin or a silicon resin. It is also possible to manufacture the encapsulation member by applying a manufactured encapsulation member 150 to the blue LED 110 or stacking it thereon as a thin layer and then curing and fixing the encapsulation member for about an hour at a temperature of about 100° C. to about 160° C.

Figure 11:
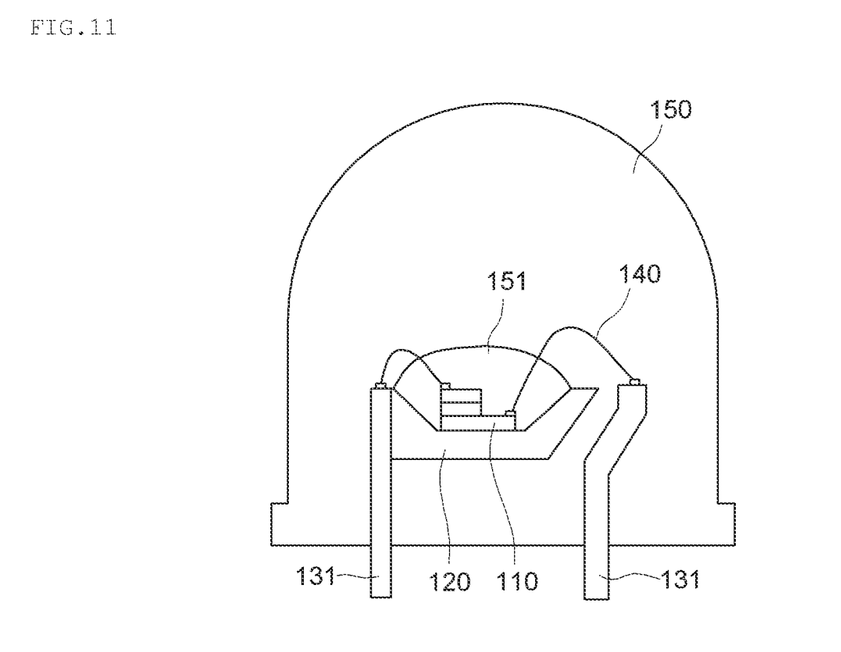
FIG. 11 is another example of a light emitting device of an embodiment.

FIG. 11 is another example of a light emitting device of an embodiment.

In describing the light emitting device as shown in FIG. 11, descriptions provided with respect to the light emitting device as shown in FIG. 10 are not provided.

Referring to FIG. 11, the light emitting device may include the blue LED 110, the body 120 supporting the blue LED 110 and reflecting light emitted from the blue LED 110 upwardly, two electrodes 131 providing power to the blue LED 110 and electrically insulated, the wire 140 electrically connecting the blue LED 110 to the two electrodes 131, the phosphor 151 scattered over a light transmission resin formed of an epoxy resin or a silicon resin molding the blue LED 110, and the encapsulation member 150 encapsulating the blue LED 110, the body 120, the phosphor 151, and the wire 140. The phosphor 151 may be phosphors as described in the embodiments as described in FIG. 10.

Figure 12:
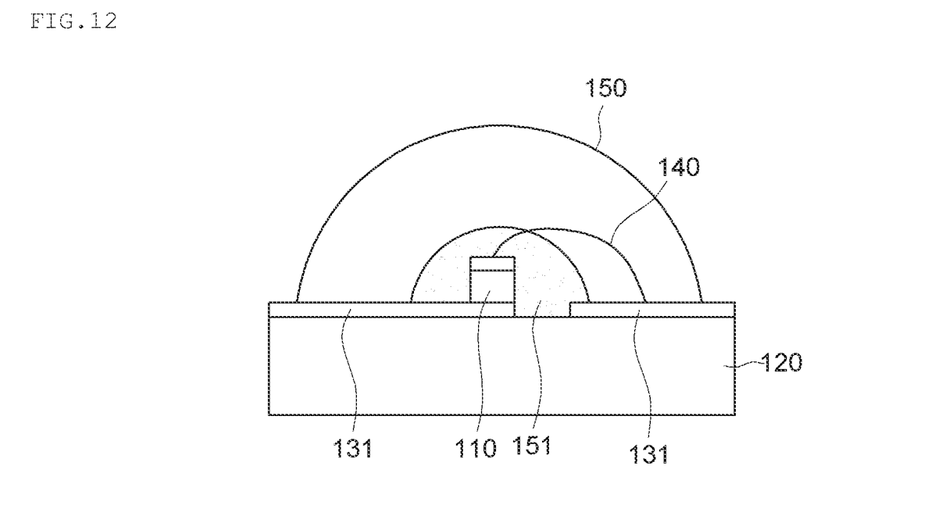
FIG. 12 is another example of a light emitting device of an embodiment.

FIG. 12 is another example of a light emitting device of an embodiment.

In describing the light emitting device as shown in FIG. 12, descriptions provided with respect to the light emitting device as shown in FIG. 10 are not provided.

Referring to FIG. 12, the light emitting device may include the blue LED 110, the body 120 supporting the blue LED 110 and reflecting light emitted from the blue LED 110 upwardly, two electrodes 131 patterned on the body 120 and providing power to the blue LED 110, the wire 140 electrically connecting the blue LED 110 to any one of the two electrodes 131, the phosphor 151 scattered over a light transparent resin molding the blue LED 110, and the encapsulation member 150 arranged on the body to encapsulate the blue LED 110. The phosphor 151 may be phosphors as described in the embodiments as described in FIG. 10.

Figure 13:
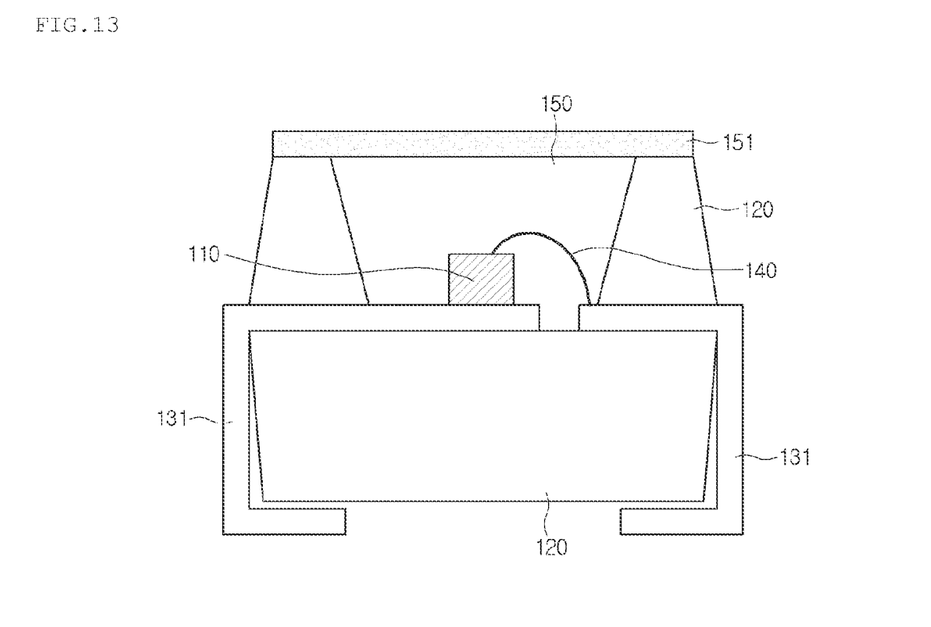
FIG. 13 is another example of a light emitting device of an embodiment.

FIG. 13 is another example of a light emitting device of an embodiment.

In describing the light emitting device as shown in FIG. 13, descriptions provided with respect to the light emitting device as shown in FIG. 10 are not provided.

Referring to FIG. 13, the light emitting device may include the blue LED 110, the body 120 supporting the blue LED 110 and reflecting light emitted from the blue LED 110 upwardly, two electrodes 131 passing through the body 120 so that one side is arranged in a cavity formed in the body 120 and the other side is arranged at the bottom of the body 120 and providing power to the blue LED 110, the wire 140 electrically connecting the blue LED 110 to any one of the two electrodes 131, the encapsulation member 150 including a light transparent resin molding the blue LED 110, and the phosphor 151 arranged on the body 120 and/or the encapsulation member 150. The phosphor 151 may be phosphors as described in the embodiments as described in FIG. 10.

The phosphor 151 may be scattered over the light transparent resin or be evenly disposed on the body 120 and/or the encapsulation member 150. That is, the phosphor 151 may also be disposed by conformal coating.

The blue LED 110 may be arranged in the cavity in the body 120 at an interval from the phosphor 151.

Figure 14:
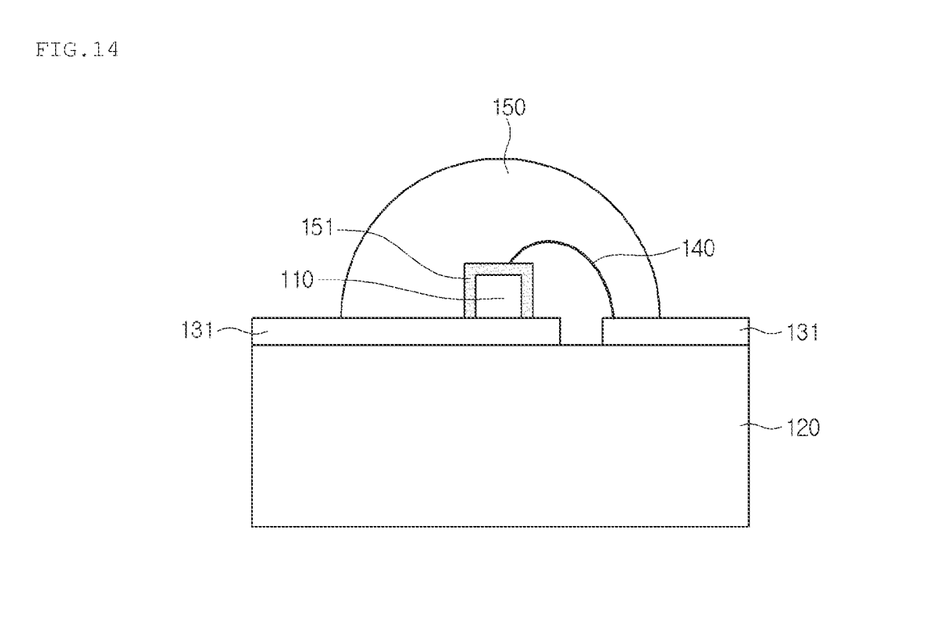
FIG. 14 is another example of a light emitting device of an embodiment.

FIG. 14 is another example of a light emitting device of an embodiment.

In describing the light emitting device as shown in FIG. 14, descriptions provided with respect to the light emitting device as shown in FIG. 10 are not provided.

Referring to FIG. 14, the light emitting device may include the blue LED 110, the body 120 supporting the blue LED 110 and reflecting light emitted from the blue LED 110 upwardly, two electrodes 131 patterned on the body 120 and providing power to the blue LED 110, the wire 140 electrically connecting the blue LED 110 to any one of the two electrodes 131, the phosphor 151 disposed on the blue LED 110, and the encapsulation member 150 arranged on the body to encapsulate the blue LED 110. The phosphor 151 may be phosphors as described in the embodiments as described in FIG. 10.

The phosphor 151 may be disposed evenly on the surface of the blue LED 110 and be in contact with the top and sides of the blue LED 110.

Figure 15:
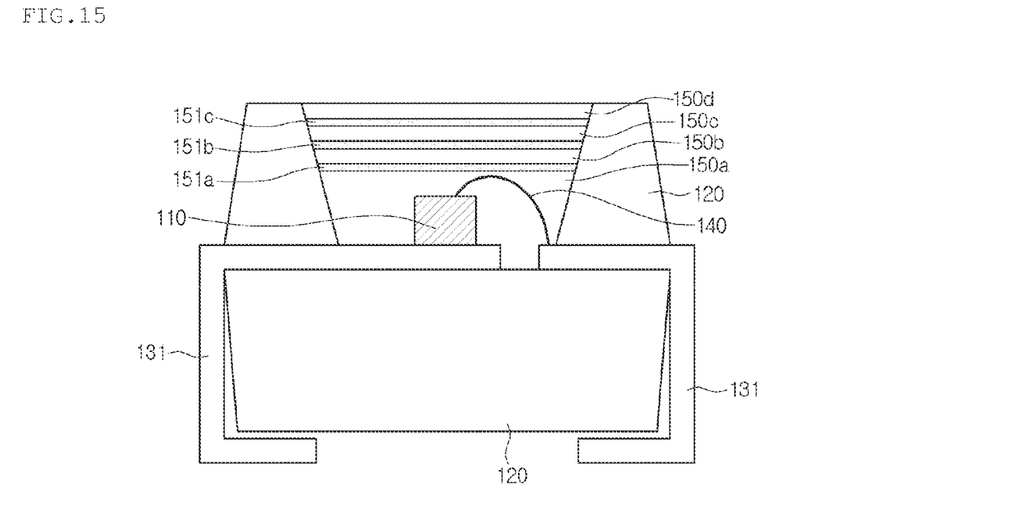
FIG. 15 is another example of a light emitting device of an embodiment.

FIG. 15 is another example of a light emitting device of an embodiment.

In describing the light emitting device as shown in FIG. 15, descriptions provided with respect to the light emitting device as shown in FIG. 10 are not provided.

Referring to FIG. 15, the light emitting device includes the blue LED 110, the body 120 supporting the blue LED 110 and reflecting light emitted from the blue LED 110 upwardly, two electrodes 131 providing power to the blue LED 110 on the body 120, and the wire 140 electrically connecting the blue LED 110 to any one of the two electrodes 131. The blue LED 110 may be arranged on the other of the two electrodes 131 to be electrically connected thereto.

Also, the light emitting device may include a first encapsulation member 150a encapsulating the blue LED 110, a first phosphor 151a disposed on the first encapsulation member 150a, a second encapsulation member 150b disposed on the first phosphor 151a, a second phosphor 151b disposed on the second encapsulation member 150b, a third encapsulation member 150c disposed on the second phosphor 151b, a third phosphor 151c disposed on the third encapsulation member 150c and a fourth encapsulation member 150d disposed on the third phosphor 151c. The first to third phosphors 151a to 151c may be spaced apart from the blue LED 110 and may be spaced apart from one another. The first to third phosphors 151a to 151c may be phosphors according to the first embodiment.

For example, the first to fourth encapsulation members 150a to 150d may be formed of an epoxy resin or silicon resin.

The light emitting device includes at least two kinds of phosphors and in embodiments, three kinds of phosphors are illustrated as the first to third phosphors 151a to 151c.

For example, it is possible to include only the blue LED 110 and the first and second phosphors 151a and 151b, in which case the first and second phosphors 151a and 151b may be phosphors according to the second embodiment.

Figure 16:
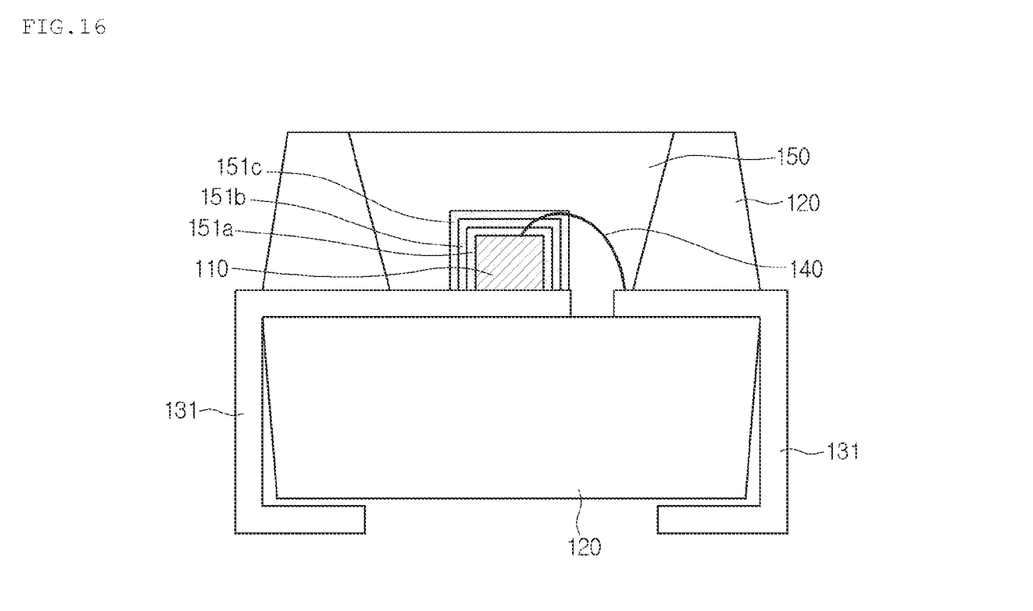
FIG. 16 is another example of a light emitting device of an embodiment.

FIG. 16 is another example of a light emitting device of an embodiment.

In describing the light emitting device as shown in FIG. 16, descriptions provided with respect to the light emitting device as shown in FIG. 15 are not provided.

Referring to FIG. 16, the light emitting device includes the blue LED 110, the body 120 supporting the blue LED 110 and reflecting light emitted from the blue LED 110 upwardly, two electrodes 131 providing power to the blue LED 110 on the body 120, and the wire 140 electrically connecting the blue LED 110 to any one of the two electrodes 131. The blue LED 110 may be arranged on the other of the two electrodes 131 to be electrically connected thereto.

Also, the light emitting device may include a first phosphor 151a arranged on the top and sides of the blue LED 110 to encapsulate the blue LED 110, a second phosphor 151b arranged on the first phosphor 151a and on the top and sides of the blue LED 110 to encapsulate the blue LED 110, a third phosphor 151c arranged on the second phosphor 151b and on the top and sides of the blue LED 110 to encapsulate the blue LED 110, and the encapsulation member 150 encapsulating the first to third phosphors 151a to 151c.

For example, the first phosphor 151a may also be in contact with the blue LED 110, the second phosphor 151b may also be in contact with the first phosphor 151a and spaced apart from the blue LED 110, and the third phosphor 151c may also be in contact with the second phosphor 151b and spaced apart from the blue LED 110.

The encapsulation member 150 may be formed of an epoxy resin or silicon resin and the first to third phosphors 151a to 151c are the same as those in FIG. 15.

Also, when two kinds of phosphors are used according to the second embodiment, the light emitting device may include the first phosphor 151a encapsulating the blue LED 110, the second phosphor 151b arranged on the first phosphor 151a and on the top and sides of the blue LED 110 to encapsulate the blue LED 110, and the encapsulation member 150 encapsulating the first and second phosphors 151a and 151b.

Figure 17:
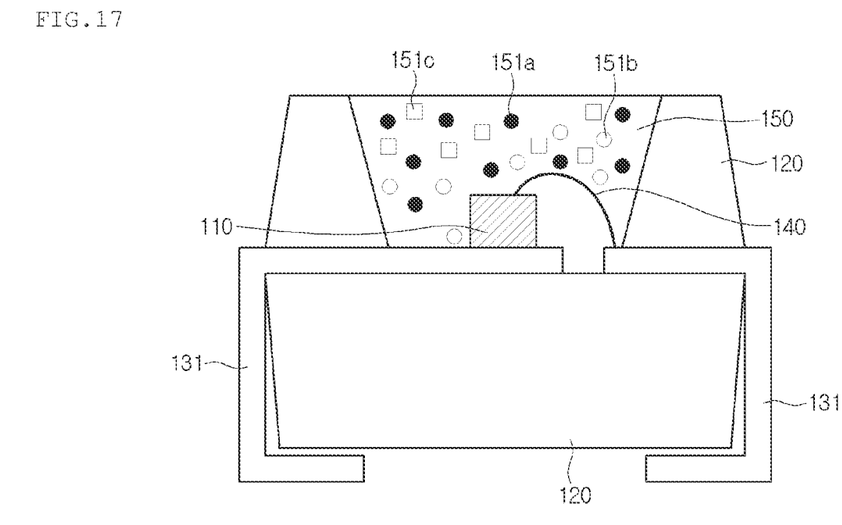
FIG. 17 is another example of a light emitting device of an embodiment.

FIG. 17 is another example of a light emitting device of an embodiment.

In describing the light emitting device as shown in FIG. 17, descriptions provided with respect to the light emitting device as shown in FIG. 15 are not provided.

Referring to FIG. 17, the light emitting device includes the blue LED 110, the body 120 supporting the blue LED 110 and reflecting light emitted from the blue LED 110 upwardly, two electrodes 131 providing power to the blue LED 110 on the body 120, and the wire 140 electrically connecting the blue LED 110 to any one of the two electrodes 131. The blue LED 110 may be arranged on the other of the two electrodes 131 to be electrically connected thereto.

Also, the light emitting device includes the encapsulation member 150 encapsulating the blue LED 110, and the first to third phosphors 151a to 151c that are scattered in the encapsulation member 150.

The encapsulation member 150 may be formed of an epoxy resin or silicon resin and the first to third phosphors 151a to 151c are the same as those in FIG. 15.

Figure 18:
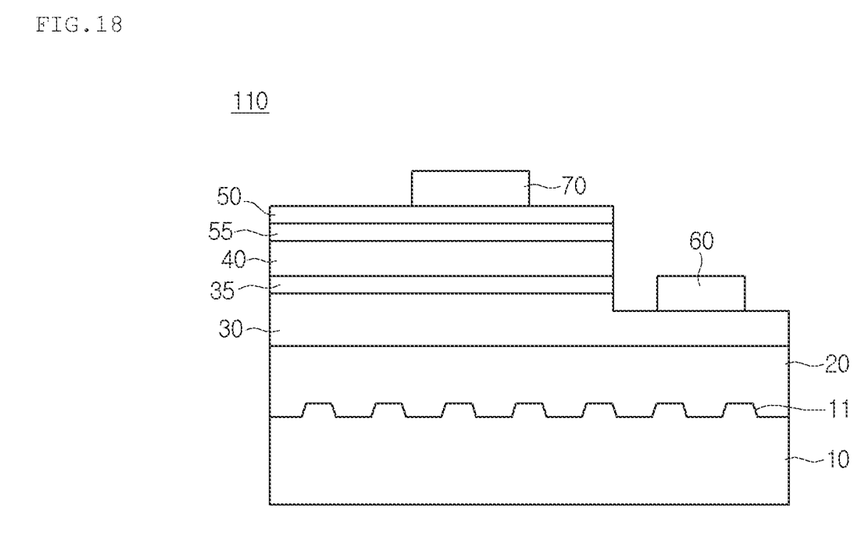
FIG. 18 is an example of a blue LED capable of being used in a light emitting device of an embodiment.

FIG. 18 is an example of a blue LED capable of being used in a light emitting device of an embodiment.

The blue LED 110 according to the embodiment includes a emissive layer that includes an un-doped semiconductor layer 20 on a substrate 10, a first conductive semiconductor layer 30 on the un-doped semiconductor layer 20, an active layer 40, and a second conductive semiconductor layer 50, in which case a first electrode 60 is disposed on the first conductive semiconductor layer 30 and a second electrode 90 is disposed on the second conductive semiconductor layer 50.

Also, a first conductive InGaN/GaN super-lattice structure or InGaN/InGaN super-lattice structure 35 may also be formed between the first conductive semiconductor layer 30 and the active layer 40.

Also, a second conductive AlGaN layer 55 may also be disposed between the second conductive semiconductor layer 50 and the active layer 40.

The substrate 10 may be formed of at least one of sapphire ($Al_2O_3$), silicon carbide (SiC), gallium arsenide (GaAs), gallium nitride (GaN), zinc oxide (ZnO), silicon (Si), gallium phosphorous (GaP), indium phosphorous (InP), germanium (Ge) and is not limited thereto. For example, the substrate 10 functions as a growth substrate on which the emissive layer grows and may be a sapphire substrate.

A plurality of protruding patterns 11 may be formed on the substrate 10 and scatter light emitted from the active layer 40 and thus increase light efficiency.

For example, the protruding pattern 11 may be formed in the shape of any one of a hemisphere, a polygon, a triangular pyramid, and a nano-pillar.

A first conductive dopant is not injected into the un-doped semiconductor layer 20 intentionally, which is however a nitride capable of having a first conductive characteristic and may be formed in an undoped-GaN layer. A buffer layer may also be disposed between the undoped semiconductor layer 20 and the substrate 10. Also, the undoped semiconductor layer 20 is not necessarily disposed, which may, that is, not be disposed.

The first conductive semiconductor layer 30 may include an n-type semiconductor layer, for example. The first conductive semiconductor layer 30 may be selected from semiconductor materials having the formula $In_xAl_yGa_{1-x-y}N$ (where $0 \leq x \leq$, $0 \leq y \leq 1$, $0 \leq x+y \leq 1$), such as InAlGaN, GaN, AlGaN, AlInN, InGaN, AlN, and InN, and an n-type dopant using Si, Ge or Sn may be doped.

The active layer 40 is a layer on which an electron (or a hole) injected through the first conductive semiconductor layer 30 meets with a hole (or an electron) injected through the second conductive semiconductor layer 50 to emit light by the band gap difference of an energy band depending on a material forming the active layer 40.

The active layer 40 may be formed in any one of a single quantum well structure, a multi-quantum well structure (MQW), a quantum dot structure or a quantum wire structure but is not limited thereto.

The active layer 40 may be formed of a semiconductor material having the formula $In_xAl_yGa_{1-x-y}N$ (where $0 \leq x \leq 1$, $0 \leq y \leq 1$, and $0 \leq x+y \leq 1$). When the active layer 40 is formed in the MQW structure, the active layer 40 may be disposed by the stacking of a plurality of well layers and a plurality of barrier layers, such as an InGaN well layer/GaN barrier layer.

A clad layer (not shown) with doped with a n-type or p-type dopant may be disposed on and/or under the active layer 40 and the clad layer (not shown) may be implemented in an AlGaN layer or InAlGaN layer.

The second conductive semiconductor layer 50 may be implemented in a p-type semiconductor layer, for example. The second conductive semiconductor layer 50 may be selected from semiconductor materials having the formula $In_xAl_yGa_{1-x-y}N$ (where $0 \le x \le 1$, $0 \le y \le 1$, and $0 \le x+y \le 1$), such as InAlGaN, GaN, AlGaN, InGaN, AlInN, AlN, and InN, and a p-type dopant using Mg, Zn, Ca, Sr, or Ba may be doped.

On the contrary, the first conductive semiconductor layer 30 may include the p-type semiconductor layer and the second conductive semiconductor layer 50 may also include the n-type semiconductor layer. Also, a third conductive semiconductor layer (not shown) that includes an n-type or p-type semiconductor layer may also be disposed on the second conductive semiconductor layer 50 and accordingly, the emissive layer may have at least one of np, pn, npn, and pnp junction structures. Also, the doping concentration of a dopant in the first conductive semiconductor layer 30 and the second conductive semiconductor layer 50 may be uniform or non-uniform. That is, the structure of the emissive layer may vary and has no limitation.

The first electrode 60 is arranged on the first conductive semiconductor layer 30 and the second electrode 70 is arranged on the second conductive semiconductor layer 50 so that they provide power to the active layer.

The blue LED may be a GaN based LED having a main wavelength of about 445 nm to about 460 nm, e.g., about 455 nm.

Figure 19:
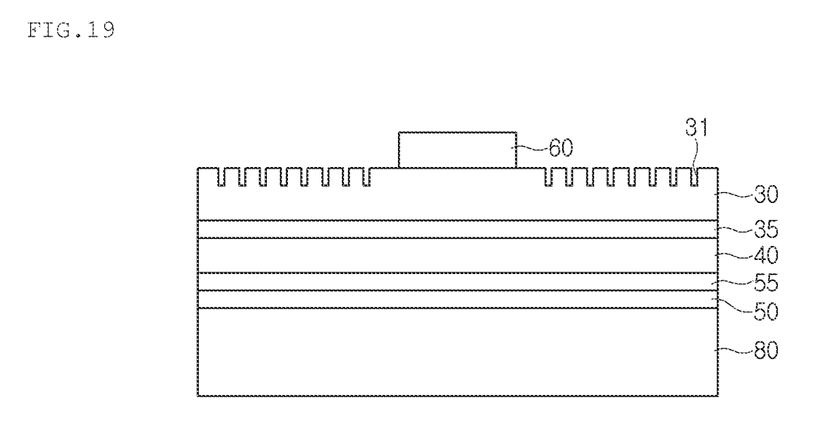
FIG. 19 is an example of a blue LED capable of being used in a light emitting device of an embodiment.

FIG. 19 is an example of a blue LED capable of being used in a light emitting device of an embodiment. In describing the blue LED shown in FIG. 19, descriptions of the blue LED as shown in FIG. 18 are not provided.

Referring to FIG. 19, the blue LED may include an emissive layer including a conductive support substrate 80, a first conductive semiconductor layer 30 on the conductive support substrate 80, an active layer 40, and a second conductive semiconductor layer 50, and a first electrode 60 on the first conductive semiconductor layer 30.

Also, a first conductive InGaN/GaN super-lattice structure or InGaN/InGaN super-lattice structure 35 may also be formed between the first conductive semiconductor layer 30 and the active layer 40.

Also, a second conductive AlGaN layer 55 may also be disposed between the second conductive semiconductor layer 50 and the active layer 40.

Also, a light extracting structure 31 having a pillar or hole shape may be formed in the first conductive semiconductor layer 30, and the light extracting structure 30 enables light emitted from the active layer 40 to be effectively extracted to the outside.

For example, the light extracting structure 31 may be formed in the shape of any one of a hemisphere, polygon, triangular pyramid, and nano-pillar and may also be formed of photonic crystal.

The conductive support substrate 80 may support the emissive layer and provide power to the emissive layer along with the electrode 60.

The conductive support substrate 175 may include a support layer, reflective layer and ohmic contact layer, and the support layer may include at least one of copper (Cu), gold (Au), nickel (Ni), molybdenum (Mo), copper/tungsten (Cu/W) alloy, or a carrier wafer (e.g., silicon (Si), germanium (Ge), gallium arsenide (GaAs), zinc oxide (ZnO), or silicon carbide (SiC)). Also, the reflective layer may be formed of a metal including silver (Ag) or aluminum (Al), and the ohmic contact layer may be formed of a material being in ohmic contact with the second conductive semiconductor layer 50 and implemented in a single layer or multiple layers by using one or more of an indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), an $IrO_x$, an RuOx, an $RuO_x/ITO$, Ni, Ag, $Ni/IrO_x/Au$, or $Ni/IrO_x/Au/ITO$, for example.

The emissive layer may include a plurality of III group to V group compound semiconductor layers.

The first conductive semiconductor layer 30 may include an n-type semiconductor layer, for example. The first conductive semiconductor layer 30 may be selected from semiconductor materials having the formula $In_xAl_yGa_{1-x-y}N$ (where $0 \le x \le 1$, $0 \le y \le 1$, and $0 \le x+y \le 1$), such as InAlGaN, GaN, AlGaN, AlInN, InGaN, AlN, and InN, and an n-type dopant using Si, Ge or Sn may be doped.

The active layer 40 is a layer on which an electron (or a hole) injected through the first conductive semiconductor layer 30 meets with a hole (or an electron) injected through the second conductive semiconductor layer 50 to emit light by the band gap difference of an energy band depending on a material forming the active layer 40.

The active layer 40 may be formed in any one of a single quantum well structure, a multi-quantum well structure (MQW), a quantum dot structure or a quantum wire structure but is not limited thereto.

The active layer 40 may be formed of a semiconductor material having the formula $In_xAl_yGa_{1-x-y}N$ (where $0 \le x \le 1$, $0 \le y \le 1$, and $0 \le x+y \le 1$). When the active layer 40 is formed in the MQW structure, the active layer 40 may be disposed by the stacking of a plurality of well layers and a plurality of barrier layers, such as an InGaN well layer/GaN barrier layer.

A clad layer (not shown) with doped with a n-type or p-type dopant may be disposed on and/or under the active layer 40 and the clad layer (not shown) may be implemented in an AlGaN layer or InAlGaN layer.

The second conductive semiconductor layer 50 may be implemented in a p-type semiconductor layer, for example. The second conductive semiconductor layer 50 may be selected from semiconductor materials having the formula $In_xAl_yGa_{1-x-y}N$ (where $0 \le x \le 1$, $0 \le y \le 1$, and $0 \le x+y \le 1$), such as InAlGaN, GaN, AlGaN, InGaN, AlInN, AlN, and InN, and a p-type dopant using Mg, Zn, Ca, Sr, or Ba may be doped.

On the contrary, the first conductive semiconductor layer 30 may include the p-type semiconductor layer and the second conductive semiconductor layer 50 may also include the n-type semiconductor layer. Also, a third conductive semiconductor layer (not shown) that includes an n-type or p-type semiconductor layer may also be disposed on the second conductive semiconductor layer 50 and accordingly, the emissive layer may have at least one of np, pn, npn, and pnp junction structures. Also, the doping concentration of a dopant in the first conductive semiconductor layer 30 and the second conductive semiconductor layer 50 may be uniform or non-uniform. That is, the structure of the emissive layer may vary and has no limitation.

Also, a current breaking region (not shown) may be formed between the second conductive semiconductor layer 50 and the conductive support substrate 80 to at least partially overlap with the first electrode 60, may be formed of a material having lower conductivity than the conductive support substrate 80 or an electric insulating material, and may be formed by applying a plasma damage to the second conductive semiconductor layer 50. The current breaking region enables a current to flows over a wide range so that the light efficiency of the active layer 40 may increase.

The blue LED may be a GaN based LED having a main wavelength of about 445 nm to about 460 nm, e.g., about 455 nm.

Embodiments may provide a light emitting device that may emit a high color rendering white light.

Embodiments also may provide a light emitting device that may emit a high color rendering white light without using an expensive red phosphor.

Embodiments may also provide a light emitting device that may emit a high color rendering white light by using a blue LED and mixed phosphors of two or three kinds of phosphors.

Although only particular examples of embodiments are described in detail, it is obvious to a person skilled in the art that many variations and modifications may be implemented within the technical spirit of embodiments and these variations and modifications also fall within the following claims.

What is claimed is:

1. A light emitting device comprising:
   a blue light emitting diode (LED); and
   phosphors comprising first to third phosphors,
   wherein the first phosphor is excited by light emitted from the blue LED, emits light having a main wavelength of about 495 nm to about 510 nm, and comprises $BaSi_2O_2N_2$:Eu or $(Ba_x,Sr_{1-x})Si_2O_2N_2$:Eu where $0<x<1$,
   wherein the second phosphor is excited by light emitted from the blue LED, emits light having a main wavelength of about 555 nm to about 575 nm, and comprises $Lu_3Al_5O_{12}$:Ce or $(Lu_x,Gd_{1-x})_3Al_5O_{12}$:Ce where $0<x<1$,
   wherein the third phosphor is excited by light emitted from the blue LED, emits light having a main wavelength of about 580 nm to about 605 nm, and comprises $(Ca_x,Sr_{1-x})AlSiN_3$:Eu where $0<x<1$,
   wherein the first phosphor occupies 10 wt % to 25 wt %, the second phosphor occupies 60 wt % to 80 wt %, and the third phosphor occupies 3 wt % to 20 wt %, and
   wherein the sum of the first, second and third phosphor occupy 100 wt %.

2. The light emitting device according to claim 1, wherein the third phosphor emits light having a main wavelength of about 580 nm to about 599 nm.

3. The light emitting device according to claim 1, wherein the first phosphor is a $BaSi_2O_2N_2$:Eu phosphor.

4. The light emitting device according to claim 1, wherein the second phosphor is a $Lu_3Al_5O_{12}$:Ce phosphor.

5. The light emitting device according to claim 1, wherein the third phosphor is a $(Ca_{0.5},Sr_{0.5})AlSiN_3$:Eu phosphor.

6. The light emitting device according to claim 1, wherein the first to third phosphors are equal to or higher than 80% in internal quantum efficiency and equal to or higher than 90 in color rendering index (Ra).

7. The light emitting device according to claim 1, wherein the blue LED emits light having a peak wavelength of about 440 nm to about 460 nm and a main wavelength of about 445 nm to about 460 nm.

8. The light emitting device according to claim 1, wherein the first phosphor is a blue phosphor.

9. The light emitting device according to claim 8, wherein the second phosphor is a green phosphor.

10. The light emitting device according to claim 9, wherein the third phosphor is a yellow phosphor.

* * * * *